United States Patent [19]

Ott

[11] 4,070,110
[45] Jan. 24, 1978

[54] AUTOMATIC PLATEMAKING PROCESS AND APPARATUS

[75] Inventor: John Wright Ott, Wilmington, Del.

[73] Assignee: Hercules Incorporated, Wilmington, Del.

[21] Appl. No.: 776,031

[22] Filed: Mar. 9, 1977

Related U.S. Application Data

[62] Division of Ser. No. 585,290, June 9, 1975, abandoned.

[51] Int. Cl.$^2$ ............................................. G03B 27/30
[52] U.S. Cl. .................................................. 355/100
[58] Field of Search ....................... 355/78, 85, 97, 99, 355/100, 103

[56] References Cited

U.S. PATENT DOCUMENTS

| 3,751,164 | 8/1973 | Miller et al. | 355/100 |
| 3,813,162 | 5/1974 | Watabe et al. | 355/85 |
| 3,837,887 | 9/1974 | Akamatsu et al. | 355/100 UX |
| 3,848,998 | 11/1974 | Yonekura et al. | 355/100 |

*Primary Examiner*—Donald Griffin
*Attorney, Agent, or Firm*—James W. Peterson

[57] ABSTRACT

The invention is a high speed automatic platemaking process and apparatus for making photopolymer relief printing plates from photo transparencies. The invention eliminates lost time and motion by performing critical platemaking functions such as photopolymer printing plate lamination and back exposure in one continuous pass. Other platemaking procedures are likewise performed in combined steps and in a particular sequence to expedite plate preparation.

1 Claim, 6 Drawing Figures

AUTOMATIC PLATEMAKING PROCESS AND APPARATUS

This is a division of application Ser. No. 585,290, filed June 9, 1975 and now abandoned.

BACKGROUND OF THE INVENTION

In the past, photopolymer printing plates have been produced by semi-automatic and automatic platemaking apparatus, such as those shown in U.S. Pat. Nos. 3,837,887 and 3,848,998, respectively. Both of these patents teach a step by step process creating inherent "lost" time periods which increase the total cycle time required to produce a plate. U.S. Pat. No. 3,837,887 discloses apparatus and process for producing a photopolymer printing plate by several independent time consuming steps, such as: placing a cover film over a photo transparency; moving a carriage over said photo transparency in one direction thereby creating "lost" time; reversing the carriage and doctoring a photopolymer onto the surface thereof while pressing a backing sheet into the surface of said photopolymer; sequentially exposing the back and then the front of the photopolymer sandwich, etc.. U.S. Pat. No. 3,848,998 discloses basically the same apparatus and further includes a developer unit connected to the exposure unit. It can be seen that both of these approaches create "lost" time, which hampers the efficiency of the apparatus and increases the cost of printing. The instant invention provides a novel automatic platemaking process and apparatus which performs several platemaking procedures in a minimum number of combined steps and in a particularly novel sequence, to virtually eliminate "lost" time.

OBJECTS OF THE INVENTION

The primary object of the instant invention is to provide an automatic photopolymer platemaking process and apparatus to rapidly produce printing plates.

Another object of the instant invention is to provide a process and apparatus that is inexpensive and easy to maintain.

It is yet another object of the instant invention to provide a process and apparatus that can produce a printing plate of variable desired thickness.

SUMMARY OF THE INVENTION

The purpose of the instant invention is to provide an automatic platemaking process and apparatus that will produce printing plates rapidly and efficiently with little or no lost time or motion. To accomplish this purpose, the instant invention performs several platemaking steps in one pass of the apparatus and in a certain sequential relationship to other simultaneous and nonsimultaneous steps.

DESCRIPTION OF THE PREFERRED EMBODIMENT

Figure 1:
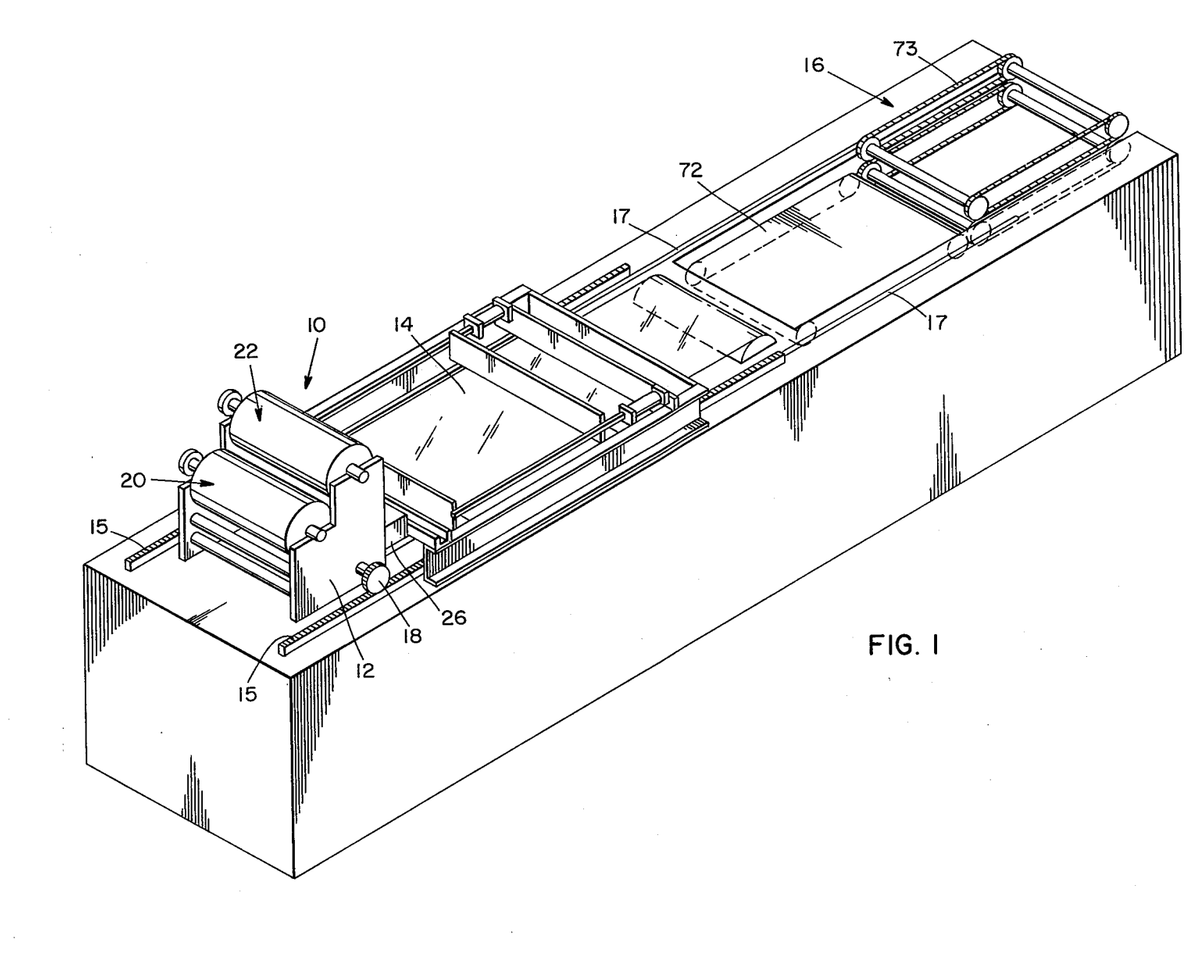
FIG. 1 is a perspective view of the platemaking apparatus which performs the process of the instant invention.
Figure 2:
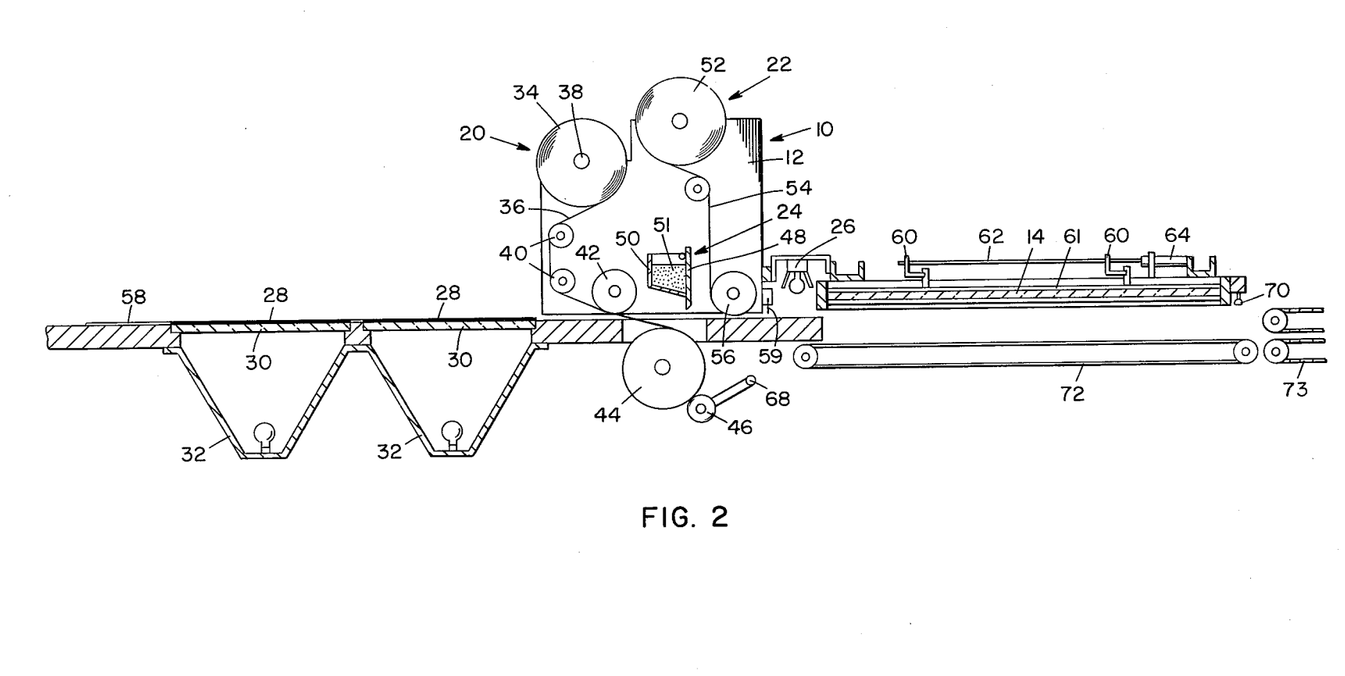
FIG. 2 is a partial cross-sectional view of the exposure portion of the apparatus shown in FIG. 1 before the platemaking process is started.

With continued reference to the drawing, FIG. 1 illustrates the platemaking apparatus of the instant invention having a platemaking section noted generally at 10, including carriage means 12 and flattening platen 14. The developer section of the platemaking apparatus is noted generally at 16. The carriage means 12 traverses the machine on racks 15 and rails 17 which contact respectively pinions 18 and guides (not shown) on the carriage assembly. The carriage means 12 comprises: cover film applicator means, shown generally at 20; backing sheet applicator means, shown generally at 22; phoopolymer resin applicator means, shown generally at 24 (see FIG. 2); and back exposure lamp means 26. In the preferred embodiment, two photo transparencies 28 are placed in side by side relationship by the machine operator on individual glass plates 30 (see FIG. 2). Glass plates 30 are mounted directly over main exposure lamp and reflector means 32, the operation of which will be discussed later. Materials other than glass that would permit the transmission of light or actinic radiation could likewise be used. In FIG. 2, the carriage means 12 is shown at its initial starting position. Cover film supply means 20 comprises cover film supply roll 34, which supplies a continuous cover film 36 under constant tension by the use of a clutch and torsion spring combination (not shown) on shaft 38. Continuous cover film 36 is fed over guide means 40 and under eccentrically mounted cover film applicator roller 42. Applicator roller 42 is mounted by clutch and eccentric means (not shown) whereby applicator roller 42 moves downward upon initial rotation of the applicator roller 42 when the carriage assembly moves to the left, as shown in FIG. 2. The applicator roller 42 remains down while the carriage means 12 moves to the left. Upon return movement of the carriage means 12 to the right, the applicator roller 42 moves upward and away from the platemaking surface. Continuous cover film 36 then contacts rubber covered roller 44 and is wound onto cover film stripper 46 upon return movement of the carriage means 12, as will be discussed later.

Photopolymer resin applicator means 24, having liquid photopolymer resin 51 contained therein, is located directly behind applicator roller 42. Photopolymer resin applicator means 24 comprises doctor blade portion 48 and rotating scoop means 50 pivotally mounted to plate 48 (see FIG. 3).

The photopolymer resins disclosed in the aforementioned U.S. Pat. Nos. 3,837,887 and 3,848,998 may be utilized in photopolymer resin applicator means 24. It is understood, however, that the invention is not limited to the use of these particular photopolymer resins.

Backing sheet supply means 22 is located behind photopolymer resin supply means 24. Backing sheet supply means 22 comprises backing sheet supply roll 52 and shim roller 56, said backing sheet supply roll 52 being mounted to the carriage 12 by a clutch and torsion spring combination (not shown) to constantly tension continuous backing sheet 54 as it is guided in wrinkle-free fashion over a guide and around shim roller 56. Shim roller 56 rides on shim 58 as it moves across the photo transparencies 28. The height of shim 58 corresponds to the combined thickness of the continuous backing sheet 54, photopolymer 51, continuous cover film 36 and photo transparencies 28. It can be seen that a thicker shim may be used and more photopolymer resin applied to produce any desired thickness of printing plate. Polyester, polyethylene, polypropylene, polyvinyl chloride, polyvinylidene chloride, polyvinyl acetate, cellophane or the like may be utilized for backing sheet 54. The photopolymer 51 and continuous backing sheet 54 are bonded together in the platemaking process, as will be described later, to form relief printing plate 71. Severing means 59 in the form of an electrically energized vertically movable hot wire is located behind shim roller 56. Traveling back exposure lamp 26 is located behind severing means 59. Vertically movable floating flattening platen 14 is located behind traveling back exposure lamp 26.

Figure 3:
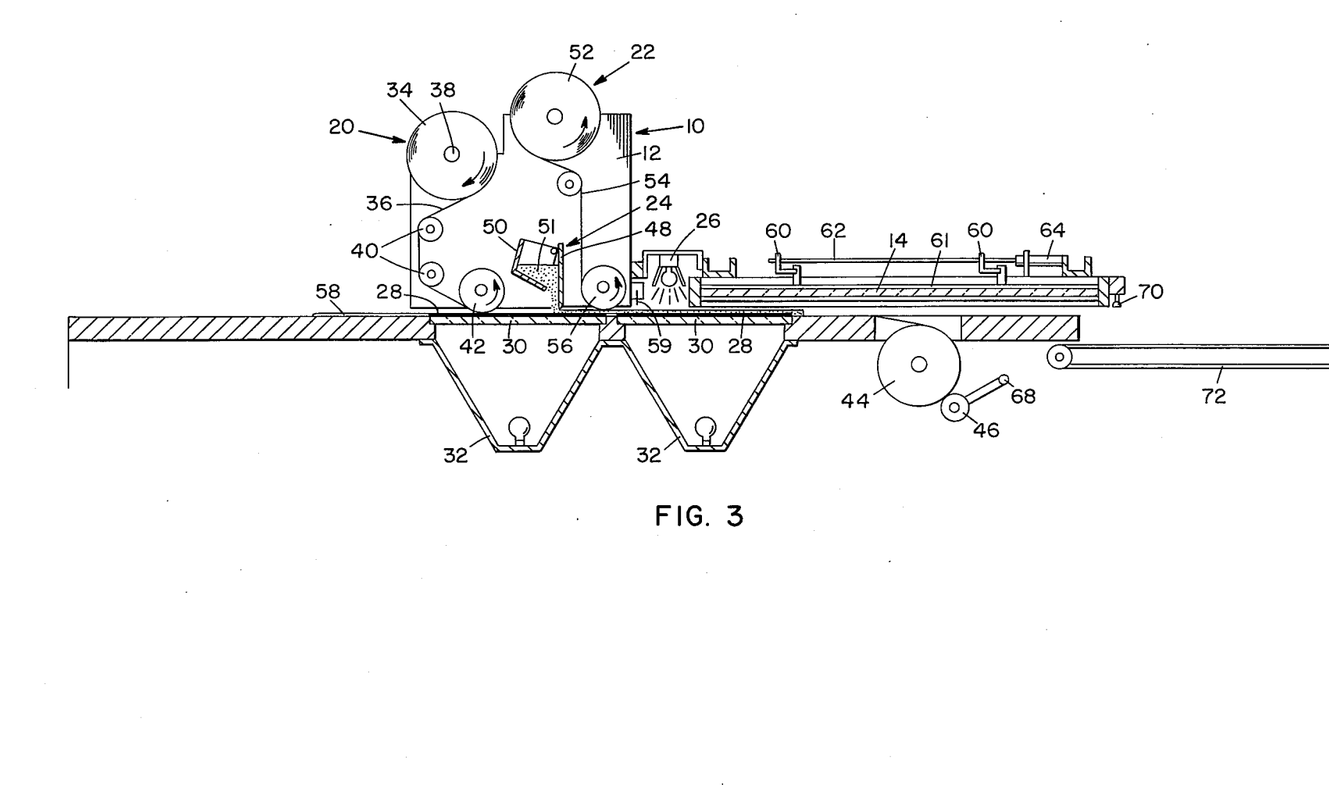
FIG. 3 is a partial cross-sectional view, as in FIG. 2, showing preparation of the photopolymer printing plate.

As can be seen in FIG. 3, the carriage means 12 has moved to the left over top of photo transparencies 28. Continuous cover film 36 is applied in wrinkle-free fashion on top of photo transparencies 28 by applicator roller 42, which has moved downward to press continuous cover film 36 into contact with photo transparencies 28. At the same time, scoop 50 has rotated with respect to doctor blade portion 48 to dump the liquid photopolymer resin 51 onto the surface of continuous cover film 36. Doctor blade portion 48 doctors the liquid photopolymer resin evenly onto the surface of the continuous cover film 36. Continuous backing sheet 54 is immediately applied by shim roller 56 onto the surface of the photopolymer resin 51 at a predetermined height. Traveling back exposure lamp means 26 is a source of actinic radiation which immediately crosslinks and polymerizes the photopolymer resin adjacent to the continuous backing sheet 54 and solidifies it. The exposure time for back exposure corresponds to the time it takes carriage means 12 to traverse glass plates 30. The degree of exposure required by the photopolymer resin 51 is controlled by varying the voltage to traveling back exposure lamp means 26, and, therefore, the intensity of light emitted. Thus, it can be seen that the movement of the carriage means 12 over the photo transparencies 28 accomplishes the application of the continuous cover film 36, photopolymer resin 51, continuous backing sheet 54 and back exposure of the photopolymer to form a partially completed printing plate 71 in one pass. Note that the rubber covered roller 44 does not move and maintains continuous cover film 36 in position.

Figure 4:
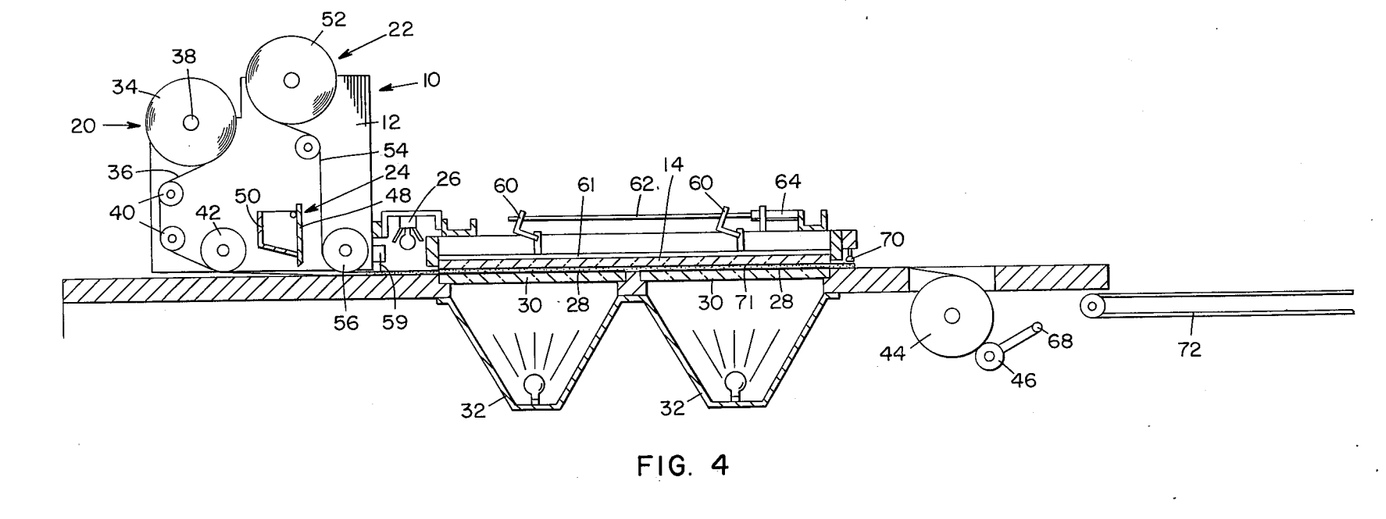
FIG. 4 is a partial cross-sectional view, as in FIG. 2, showing main exposure of the photopolymer printing plate.

In FIG. 4, flattening platen 14 has been lowered from its elevated position into contact with the partially completed printing plate 71 to maintain the printing plate's uniform thickness. Flattening platen 14 floats upon the continuous backing sheet side of the printing plate 71. Flattening platen 14 is contained at its periphery by frame 61 which allows vertical motion of the flattening platen 14 with respect to frame 61. A simple linkage of L-shaped arms 60, connecting rod 62 and horizontal actuator 64, translates horizontal movement to vertical movement to lower the frame 61 and the flattening platen 14 onto the printing plate 71 to permit flattening platen 14 to float on the printing plate and compress the same against the glass plates 30 by the flattening platen's own weight. Main exposure lamp and reflector means 32 is then actuated, producing actinic radiation to crosslink and polymerize the photopolymer resin of the printing plate through glass plates 30 and the photo transparencies 28 to selectively solidify the exposed portions. After the main exposure reverse movement to the actuator 64, the L-shaped arms 60, connecting rod 62 and frame 61 lift the flattening platen out of contact with the printing plate.

Figure 5:
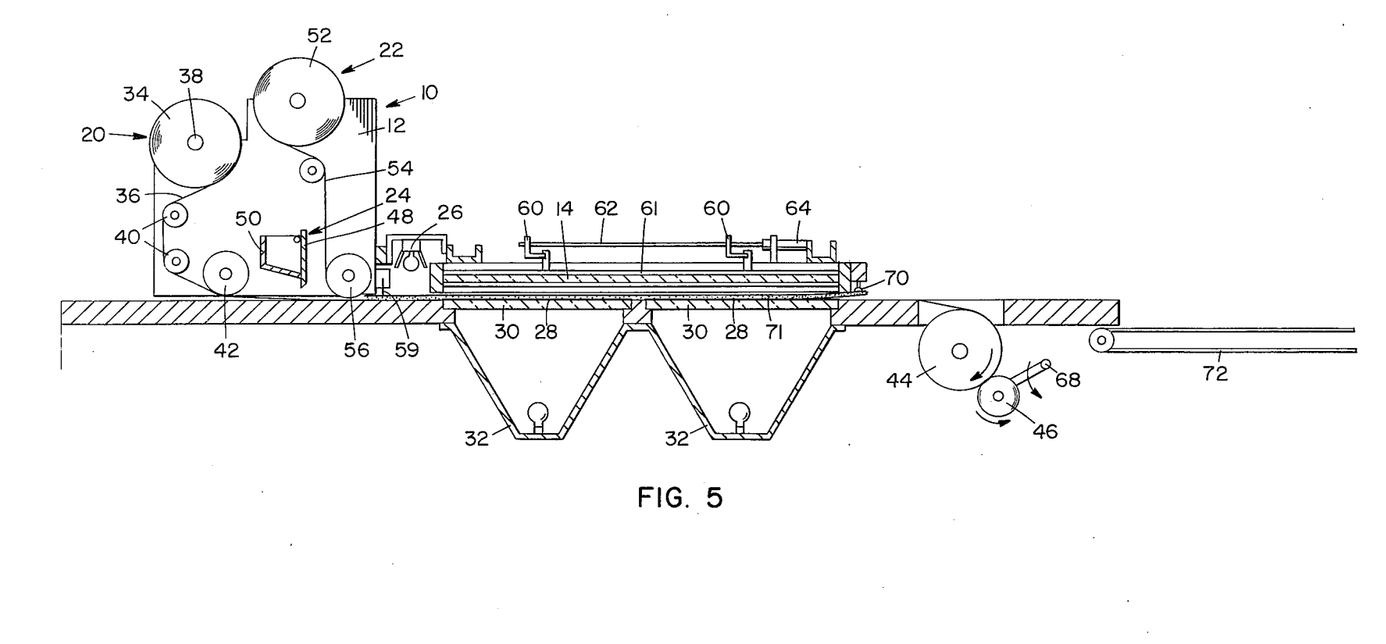
FIG. 5 is a partial cross-sectional view, as in FIG. 2, showing the delamination of the previously exposed photopolymer printing plate.

In FIG. 5, the carriage assembly moves to the right and rubber covered roller 44 is rotated as shown to drive cover film stripper 46 and strip the continuous cover film off the exposed printing plate. It is important to note that rubber covered roller 44 contacts the side of the continuous cover film that was previously in contact with the photo transparencies 28, and therefore is not contaminated by nonsolidified portions of the photopolymer resin. Cover film stripper 46 is pivotally mounted about pivot 68 to compensate for the ever increasing diameter of stripped continuous cover film 36. Movable gripper means 70 connected to flattening platen 14 by frame 61 located adjacent flattening platen 14, now in elevated position, uses negative air pressure to lift up the now leading edge of the printing plate 71 as the assembly moves to the right. Other mechanical gripper means, such as clamps or the like, could likewise be used to grip the leading edge. Note that movable gripper means 70 is movable because frame 61 is interconnected to carriage means 12 which traverses the machine. Thus it can be seen that the continuous cover film 36 and some nonsolidified (nonpolymerized) photopolymer resin is continuously removed by the cover film stripper 46 as the carriage means 12 and flattening platen 14 move to the right.

Figure 6:
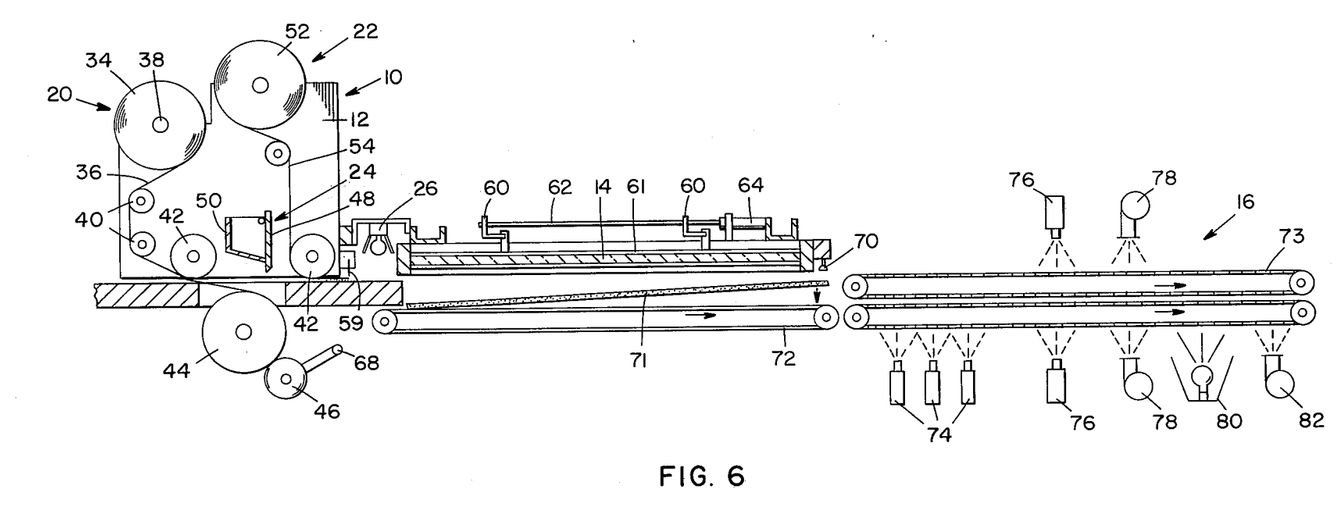
FIG. 6 is a partial cross-sectional view of the apparatus shown in FIG. 1, showing the stripped, exposed, photopolymer printing plate being introduced into the developer portion of the apparatus.

FIG. 6 illustrates the carriage means 12 and the flattening platen 14 in their extreme right position. The severing means 59 has been energized and temporarily lowered just before carriage means 12 reaches its extreme right position to sever the continuous backing sheet 54 and exposed photopolymer resin 51 but not continuous cover film 36. Gripper means 70 changes from negative air pressure to positive air pressure to blow the printing plate 71, comprising severed backing sheet 54 and exposed photopolymer resin 51, onto conveyor 72, which conveys the printing plate into the developer portion 16. As can be seen in FIG. 1, the conveyor 72 moves the printing plate 71 into double chain conveyor 73, which grasps the printing plate 71 by its edges and conveys it through the washout operation of the developer portion 16. The printing plate 71 is contacted by spray washout means 74 and then by top and bottom rinse means 76. Nonsolidified (nonpolymerized) portions of the photopolymer resin are washed away and the printing plate is then blown dry by air means 78. The printing side of the printing plate is then exposed to actinic radiation by the postexposure means 80 to further solidify (polymerize) the printing plate. Final hot air means 82 further drys the printing plate. It is understood that the printing plate is actually two printing plates corresponding to the two photo transparencies. The one large printing plate is severed by shear means not shown into two separate plates.

It is important to note that the platemaking sections sequence may be restarted and recycled as soon as the printing plate 71 has been released by gripper means 70 onto conveyor 72. In normal operation, this restart is done automatically.

While preferred embodiments of the invention have been illustrated and described, it will be appreciated that variations therefrom may be made without departing from the scope of the invention.

What I claim and desire to protect by Letters Patent is:

1. Apparatus for making a photopolymer printing plate from a photo transparency comprising:

a transparent plate;

at least one photo transparency positioned on said transparent plate;

carriage means movable over said transparent plate in one pass, said carriage means including cover film applicator means to cover said photo transparency with a continuous transparent cover film, photopolymer resin applicator means to apply photopolymer resin evenly over the continuous cover film, backing sheet supply means to roll a continuous transparent backing sheet onto said photopolymer resin at a predetermined height above said transparent plate, and back exposure lamp means to provide actinic radiation to polymerize the photopolymer resin adjacent said continuous backing sheet;

a vertically movable flattening platen connected to said carriage means, said flattening platen being vertically movable with respect to said transparent plate and floatable upon said continuous backing sheet to maintain a constant thickness of said continuous backing sheet and photopolymer resin when said flattening platen is in its lowered position;

main exposure lamp and reflector means positioned below said transparent plate to provide actinic radiation through said transparent plate and photo transparency to selectively polymerize the photopolymer resin when said flattening platen floats upon said continuous backing sheet;

movable gripper means connected to said flattening platen to grip and move said continuous backing sheet and photopolymer resin from said transparent plate;

cover film stripper positioned adjacent said transparent plate to strip said continuous cover film away from said photopolymer resin and said continuous backing sheet as they are moved from their position on said transparent plate;

severing means connected to said carriage means to sever said continuous backing sheet and photopolymer resin;

spray washout means positioned adjacent said transparent plate to receive said continuous backing sheet and photopolymer resin after they are severed by said severing means and moved by said movable gripper means to remove nonpolymerized photopolymer resin; and postexposure means positioned adjacent said spray washout means to further expose to actinic radiation said continuous backing sheet and photopolymer resin after severing and washout.

* * * * *

UNITED STATES PATENT AND TRADEMARK OFFICE
CERTIFICATE OF CORRECTION

PATENT NO. : 4,070,110
DATED : January 24, 1978
INVENTOR(S) : John Wright Ott

It is certified that error appears in the above-identified patent and that said Letters Patent are hereby corrected as shown below:

Column 2, line 25;

"phoopolymer" should read --photopolymer-- .

Signed and Sealed this

Ninth Day of May 1978

[SEAL]

Attest:

RUTH C. MASON
Attesting Officer

LUTRELLE F. PARKER
Acting Commissioner of Patents and Trademarks